(12) United States Patent
Nakamoto et al.

(10) Patent No.: US 8,527,695 B2
(45) Date of Patent: Sep. 3, 2013

(54) SYSTEM FOR UPDATING AN ASSOCIATIVE MEMORY

(75) Inventors: Kyle Masao Nakamoto, Bellevue, WA (US); Leonard Jon Quadracci, Seattle, WA (US)

(73) Assignee: The Boeing Company, Chicago, IL (US)

( * ) Notice: Subject to any disclaimer, the term of this patent is extended or adjusted under 35 U.S.C. 154(b) by 220 days.

(21) Appl. No.: 13/193,830

(22) Filed: Jul. 29, 2011

(65) Prior Publication Data
US 2013/0031325 A1 Jan. 31, 2013

(51) Int. Cl.
G06F 12/00 (2006.01)

(52) U.S. Cl.
USPC .................................. 711/108; 711/E12.017

(58) Field of Classification Search
None
See application file for complete search history.

(56) References Cited

U.S. PATENT DOCUMENTS

| 6,763,426 | B1 * | 7/2004 | James et al. .................. 711/108 |
| 7,188,211 | B2 * | 3/2007 | Roth et al. ..................... 711/108 |
| 7,193,997 | B2 * | 3/2007 | Van Lunteren et al. ....... 370/392 |
| 7,769,628 | B2 | 8/2010 | Mathews et al. |
| 8,161,045 | B2 | 4/2012 | Arnold et al. |
| 2007/0067320 | A1 | 3/2007 | Novak |
| 2008/0189260 | A1 | 8/2008 | Arnold et al. |
| 2008/0313143 | A1 | 12/2008 | Warn et al. |
| 2008/0320042 | A1 | 12/2008 | Arnold et al. |
| 2010/0205121 | A1 | 8/2010 | Quadracci et al. |
| 2010/0205192 | A1 | 8/2010 | Quadracci et al. |
| 2010/0205212 | A1 | 8/2010 | Quadracci et al. |
| 2010/0257006 | A1 | 10/2010 | Quadracci et al. |
| 2010/0268673 | A1 | 10/2010 | Quadracci |
| 2011/0307655 | A1 | 12/2011 | Gao |
| 2013/0006610 | A1 | 1/2013 | Quadracci et al. |

FOREIGN PATENT DOCUMENTS

| CN | 101866357 A | 10/2010 |
| EP | 0520684 A2 | 12/1992 |
| JP | 2002124088 A | 4/2002 |
| WO | WO03027854 A1 | 4/2003 |

OTHER PUBLICATIONS

European Search Report, dated Dec. 6, 2012, regarding Application No. EP12177203, 6 pages.

* cited by examiner

Primary Examiner — Edward Dudek, Jr.
Assistant Examiner — John P Fishburn
(74) Attorney, Agent, or Firm — Yee & Associates, P.C.

(57) ABSTRACT

A system includes an associative memory, a first table, a second table, a comparator, and an updater. The associative memory may include data and associations among data and may be built from the first table. The first table may include a record with a first and second field. The associative memory may be configured to ingest the first field and avoid ingesting the second field. The second table may include a record with a third field storing information indicating whether the first field has been ingested by the associative memory or has been forgotten by the associative memory. The comparator may be configured to compare the first and second table to identify one of whether the first field should be forgotten or ingested by the associative memory. The updater may be configured to update the associative memory by performing one of ingesting or forgetting the first field.

20 Claims, 6 Drawing Sheets

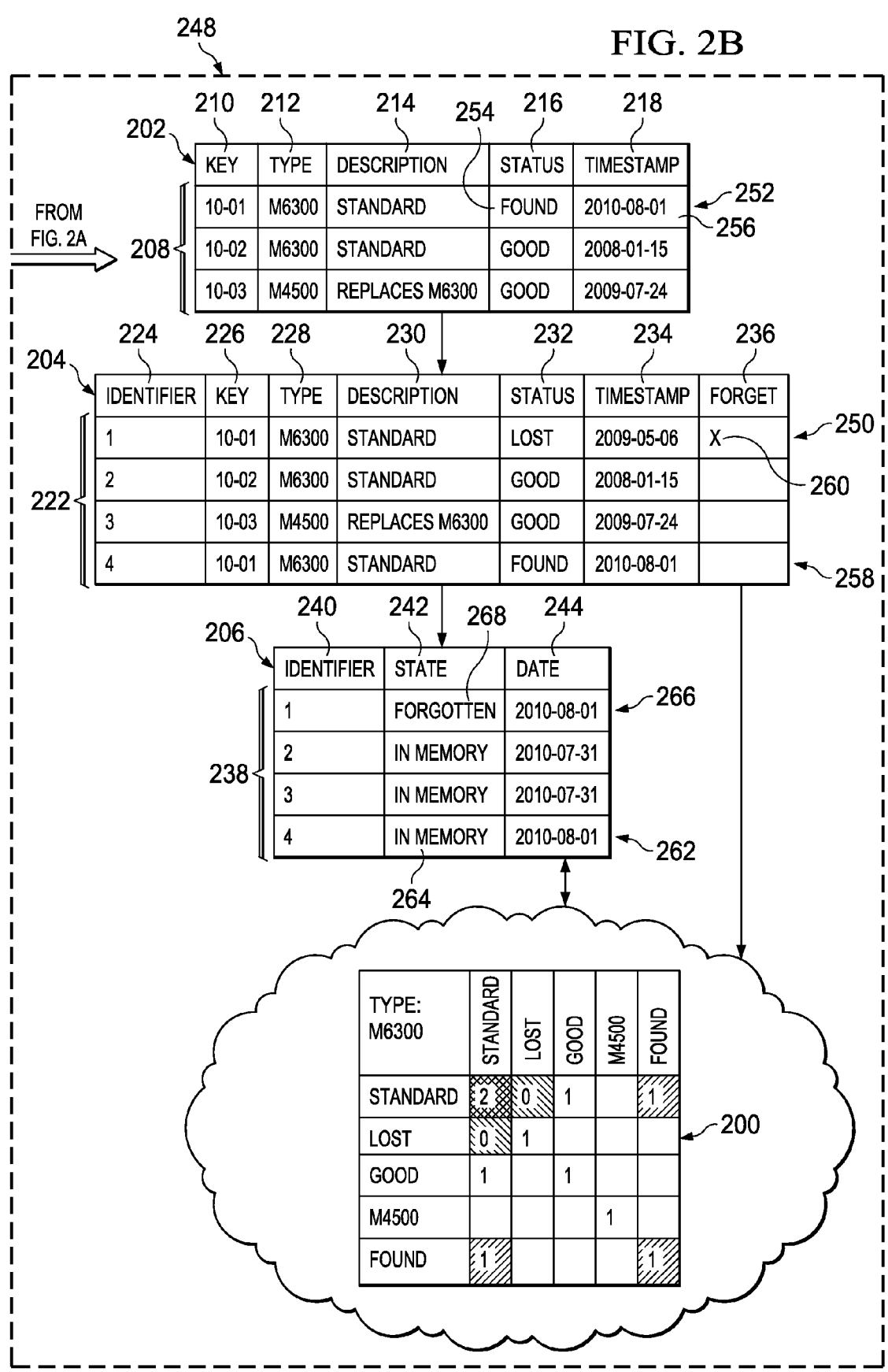

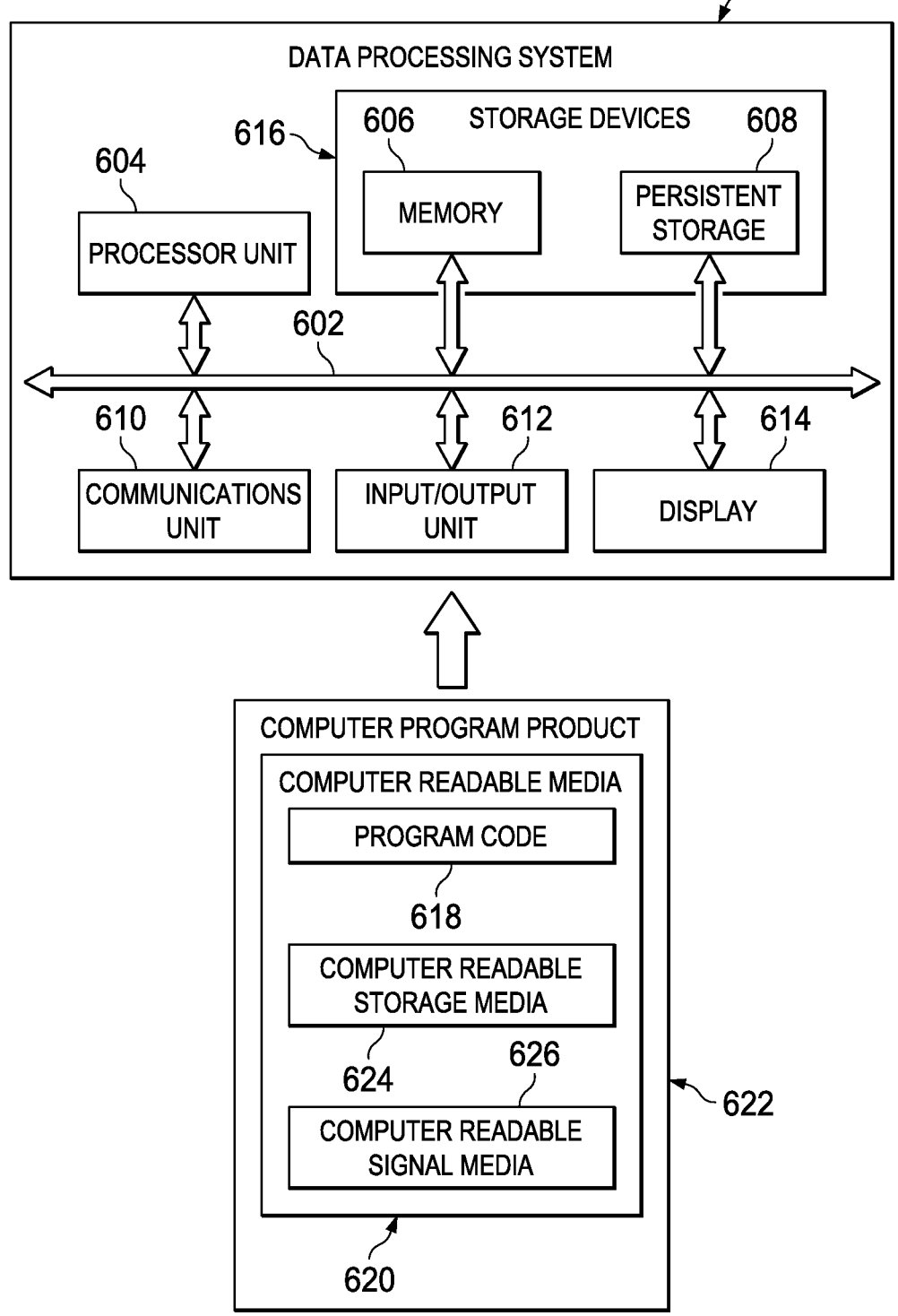

SYSTEM FOR UPDATING AN ASSOCIATIVE MEMORY

BACKGROUND INFORMATION

1. Field

The present disclosure relates to a method and apparatus for updating an associative memory.

2. Background

Associative memory technology is based on the concept of human intelligence, which also may be referred to as natural intelligence. Typically, when recalling items, events, and/or concepts from memory, human intelligence takes into account how these items, events, or concepts are related. Collectively, items, events, and/or concepts may be known as "entities". In other words, human intelligence takes into account associations between a previously experienced entity and other entities when recalling the previously experienced entity.

In this manner, human intelligence uses a memory that is based on associations in order to recall entities that have been previously experienced. This concept is the foundation for the different associative memory technologies currently being used and explored. Various types of associative memory technologies are currently present. These types include, for example, autoassociative memories and heteroassociative memories, though the advantageous embodiments described below are not limited to these types of associative memories.

Autoassociative memories are capable of retrieving a piece of data using only a portion of the piece of data. Heteroassociative memories are capable of retrieving a piece of data from one category using an associated piece of data from another category.

Typically, an associative memory system may be implemented using a neural network, artificial intelligence, and/or other suitable technologies capable of forming associations between pieces of data and then retrieving different pieces of data based on these associations. The different pieces of data in the associative memory system may come from various sources of data.

For example, an associative memory may be built using data from any number of databases, tables, spreadsheets, logs, images, files, data structures, and/or other sources of data. In particular, the associative memory is configured to ingest the data stored in these various sources of data. As used herein, the term "ingest" contemplates an associative memory incorporating new data into existing data present in the associative memory and then forming associations within the newly ingested data and/or between the newly ingested data and previously ingested data. The term "ingest" also contemplates reincorporating previously ingested data in order to form new relationships among the previously ingested data.

Oftentimes, changes are made to the data stored in these various sources of data. These changes may include, for example, adding data, removing data, modifying data, and/or other types of changes. Thereafter, it may be desirable to cause the associative memory to ingest the new versions of the sources of data in order to update the associative memory.

However, with currently available systems for updating associative memory, it may not be possible to ingest updates to existing data within an associative memory by treating the updates as "new data". Thus, in some cases, an associative memory may be updated only by recreating the entire associative memory using the new versions of the sources of data. However, as the size of the associative memory increases, the amount of time and/or effort needed to recreate the associative memory also increases. In some cases, if the associative memory is large enough, the rate of including desired updates into the associative memory may exceed the time required to recreate the associative memory.

Therefore, it would be advantageous to have a method and apparatus that takes into account at least some of the issues discussed above, as well as possibly other issues.

SUMMARY

In one advantageous embodiment, a system may include an associative memory, a first table, a second table, a comparator, and an updater. The associative memory may include a plurality of data and a plurality of associations among the plurality of data. The associative memory may be built from the first table. The first table may include a first record in which the first record may include a first field and a second field. The associative memory may be configured to ingest the first field and avoid ingesting the second field. The second table may include a second record in which the second record may include a third field. The third field stores first information indicating at least one of whether the first field has been ingested by the associative memory or has been forgotten by the associative memory. The comparator may be configured to compare the first table and the second table to identify one of whether the first field should be forgotten by the associative memory or whether the first field should be ingested by the associative memory. The updater may be configured to update the associative memory by performing one of ingesting the first field or forgetting the first field.

In another advantageous embodiment, a method for updating an associative memory is provided. An update to a first table from which the associative memory has been built may be received in a first tangible memory. The first table may comprise a first record in which the first record may comprise a first field and a second field. The associative memory may be configured to ingest the first field. The associative memory may comprise a plurality of data and a plurality of associations among the plurality of data. The associative memory may be further configured to avoid ingesting the second field. A first processor may compare the first table to a second table in a second tangible memory to identify one of whether the first field should be forgotten by the associative memory or whether the first field should be ingested by the associative memory. The second table may comprise a second record in which the second record may include a third field. The third field may store first information indicating at least one of whether the first field has been ingested by the associative memory or has been forgotten by the associative memory. A comparison may be formed. A second processor may update the associative memory by performing one of ingesting the first field or forgetting the first field.

In yet another advantageous embodiment, a non-transitory computer readable storage medium storing computer usable program code may comprise computer usable program code. Computer usable program code may be present for receiving, in a first tangible memory, an update to a first table from which the associative memory has been built. The first table may comprise a first record in which the first record may comprise a first field and a second field. The associative memory may be configured to ingest the first field. The associative memory may comprise a plurality of data and a plurality of associations among the plurality of data. The associative memory may be further configured to avoid ingesting the second field. Computer usable program code may be present for comparing the first table to a second table in a second tangible memory to identify one of whether the first field should be forgotten by the associative memory or whether the first field should be ingested by the associative memory using a first processor. The second table may comprise a second record in which the second record may include a third field. The third field may store first information indicating at least one of whether the first field has been ingested by the associative memory or has been forgotten by the associative memory. A comparison may be formed. Computer usable program code may be present for updating the associative memory by performing one of ingesting the first field or forgetting the first field using a second processor.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

FIGS. 2A and 2B are illustrations of a process flow for updating an associative memory in accordance with an advantageous embodiment;

FIG. 6 is an illustration of a data processing system in accordance with an advantageous embodiment.

DETAILED DESCRIPTION

Figure 1:
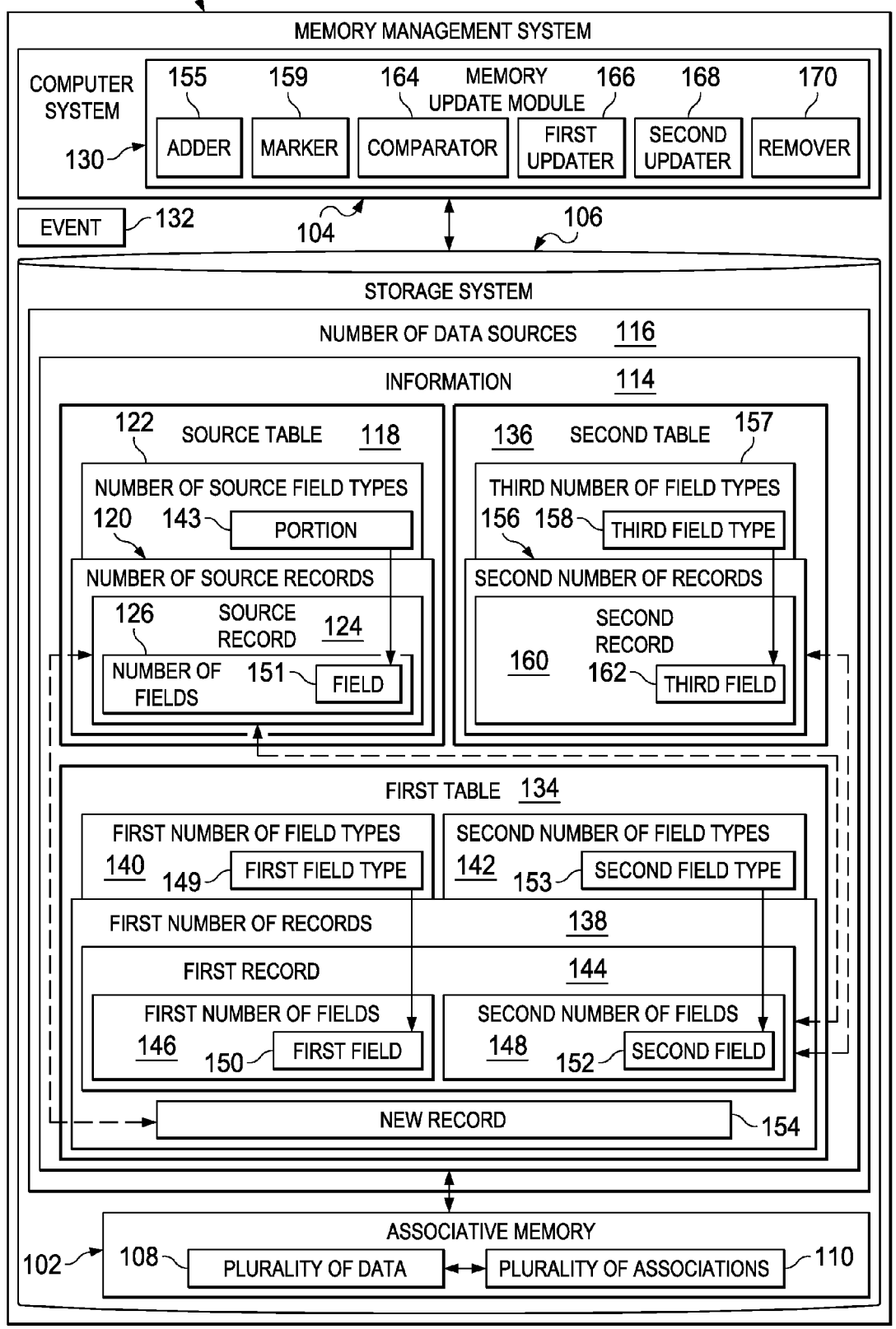
FIG. 1 is an illustration of a block diagram of a memory management system for managing an associative memory in accordance with an advantageous embodiment.

The different advantageous embodiments recognize and take into account a number of different considerations. For example, the different advantageous embodiments recognize and take into account that updating an associative memory to include updated versions of data from underlying data sources may require recreating the associative memory using the updated data.

The different advantageous embodiments recognize and take into account that recreating the associative memory may require more time, effort, and/or processing resources than desired as the size of the associative memory increases. Further, the different advantageous embodiments recognize and take into account that the process of recreating the associative memory may not provide a system for tracking the changes made in the different underlying sources of data.

Additionally, the different advantageous embodiments recognize and take into account that one solution may be for the associative memory to reingest only the sources of data in which changes to the data in the sources of data have been made. In other words, the associative memory may reingest only updated data without reingesting remaining data from the underlying data sources from which the associative memory is built.

For example, the associative memory may reingest data in a table comprising records when changes are made to the records in the table. Reingesting the data in this table may involve iterating through all of the records stored in the table even though changes to the data included only one change to one record. The different advantageous embodiments recognize and take into account that this process may use more processing resources than desired and take more time than desired.

Thus, the different advantageous embodiments may provide a method and apparatus for updating an associative memory in a manner that does not require rebuilding the associative memory. In one advantageous embodiment, a system may include an associative memory, a first table, a second table, a comparator, and an updater. The associative memory may include a plurality of data and a plurality of associations among the plurality of data.

The associative memory may be built from the first table. The first table may include a first record in which the first record comprises a first field and a second field. The associative memory may be configured to ingest the first field and avoid ingesting the second field. The second table may include a second record in which the second record includes a third field. The third field may store first information indicating at least one of whether the first field has been ingested by the associative memory or has been forgotten by the associative memory.

The comparator may be configured to compare the first table and the second table to identify one of whether the first field should be forgotten by the associative memory or whether the first field should be ingested by the associative memory. The updater may be configured to update the associative memory by performing one of ingesting the first field or forgetting the first field.

Referring now to the figures and, in particular, with reference now to FIG. 1, an illustration a block diagram of a memory management system for managing an associative memory is depicted in accordance with an advantageous embodiment. In FIG. 1, memory management system 100 may be a system configured to manage associative memory 102. In these illustrative examples, memory management system 100 may include computer system 104 and storage system 106.

Computer system 104 may include a number of computers. As used herein, a number of items means one or more items. For example, a number of computers means one or more computers. When more than one computer is present in computer system 104, these computers may be in communication with each other. Further, one or more of these computers may be in a same location and/or in different locations, in a distributed or a networked environment, depending on the implementation.

Computer system 104 may be in communication with storage system 106. Storage system 106 may include a number of storage devices in these illustrative examples. When more than one storage device is present in storage system 106, these storage devices may be in a same location and/or in different locations, in a distributed or a networked environment.

Associative memory 102 may be stored in one or more of the number of storage devices in storage system 106. In this manner, associative memory 102 may be stored in one or more locations, possibly in a distributed or networked environment, depending on the implementation.

In these illustrative examples, associative memory 102 may include plurality of data 108 and plurality of associations 110 among plurality of data 108. As used herein, an "association" in plurality of associations 110 between data in plurality of data 108 is a logical association among the data, though the association may be tangible in some hardware implementations.

As one illustrative example, a first piece of data from a first category of data in plurality of data 108 may be associated with a second piece of data from a second category of data in plurality of data 108. This association allows either one of these pieces of data to be retrieved from associative memory 102 using the other piece of data. As used herein, a "piece of data" in plurality of data 108 may also be referred to as a "datum". A "piece of data" or "datum", in these illustrative examples, may include any number of values, numbers, identifiers, labels, dates, times, and/or other suitable information, and combinations thereof.

In some illustrative examples, the association may be between a datum and a portion of the datum. In other words, the datum may be retrieved from associative memory 102 using just a portion of the datum instead of the entire datum.

In these illustrative examples, associative memory 102 may be built using information 114 stored in number of data sources 116 in storage system 106. A data source in number of data sources 116 may be any type of data structure configured for storing and organizing data. For example, number of data sources 116 may include at least one of a table, a database, a list, an array, a tree, a file, a log, a report, an image, a video, and other suitable types of sources of data.

As used herein, the phrase "at least one of", when used with a list of items, means different combinations of one or more of the listed items may be used and only one of each item in the list may be needed. For example, "at least one of item A, item B, and item C" may include, for example, without limitation, item A or item A and item B. This example also may include item A, item B, and item C, or item B and item C. In other examples, "at least one of" may be, for example, without limitation, two of item A, one of item B, and 10 of item C; four of item B and seven of item C; and other suitable combinations.

At least a portion of information 114 stored in number of data sources 116 in storage system 106 forms plurality of data 108 in associative memory 102. As used herein, "at least a portion of" information 114 means some or all of information 114. Further, "at least a portion of" a number of items, as used herein, means one, some, or all of the number of items.

Source table 118 is an example of one of number of data sources 116. Source table 118 may be, for example, a relational database used to build associative memory 102. In these illustrative examples, at least one portion of information 114 that is used to build associative memory 102 originates from source table 118.

Source table 118 may include number of source records 120 and number of source field types 122. As used herein, a "record" in a table may be a row in the table, though a "record" is not necessarily limited to a row in a table. Further, a "field type" in a table may be a column in the table, though a "field type" is not necessarily limited to a column in the table. Thus, in other illustrative examples, the terms "record" and "field type" may represent other features in the architecture of a table.

In one illustrative example, source record 124 may be an example of one of number of source records 120. Source record 124 has number of fields 126 of number of source field types 122. As used herein, a "field" in a table may be the intersection of a record and a field type in the table. This "field" may also be referred to as a "cell". In this manner, a field for each field type in number of source field types 122 may be present in number of fields 126 for source record 124.

Further, the data or value contained in a field may also be referred to as information in the field. All of number of fields 126 may or may not contain information in this illustrative example.

Source table 118 may be updatable. In other words, a user may enter user input to change the information stored in source table 118 to update source table 118. Changing the information stored in source table 118 may include at least one of adding information to, deleting information from, and/or modifying the information already stored in source table 118. In some cases, updates to source table 118 may be made by software running on computer system 104.

In these illustrative examples, memory update module 130 may be present in computer system 104. Memory update module 130 may be implemented using hardware, software, or a combination of the two. As one illustrative example, memory update module 130 may be implemented using one or more processors, which may include, for example, a first processor, a second processor, a third processor, a fourth processor, a fifth processor, and possibly more or fewer processors.

Memory update module 130 may be implemented to allow associative memory 102 to be updated based on two assumptions. The first assumption may be that the portion of information 114 from which associative memory 102 is built may not be changed or modified while associative memory 102 is built on this portion of information 114. The second assumption may be that associative memory 102 may only "forget" or remove a portion of data from plurality of data 108 when the portion of data is the same as when the portion of data was ingested by associative memory 102.

Memory update module 130 may be configured to allow associative memory 102 to ingest the information stored in source table 118 without actually ingesting source table 118. For example, memory update module 130 may be configured to create first table 134 using source table 118. The information contained in first table 134 may originate from source table 118. In this manner, associative memory 102 indirectly may ingest the information in source table 118 using the information stored in first table 134.

When associative memory 102 ingests information, associative memory 102 may incorporate this information into plurality of data 108. Further, associative memory 102 may form associations within the newly ingested information and/or between the newly ingested information and the information previously ingested by associative memory 102.

As depicted, first table 134 may include first number of records 138 as well as first number of field types 140 and second number of field types 142. First number of field types 140 may be the same as at least portion 143 of number of source field types 122 in source table 118. Associative memory 102 may be configured to ingest fields of first number of field types 140 and avoid ingesting fields of second number of field types 142 for first number of records 138. Ingesting fields may include ingesting the information in the fields.

In these illustrative examples, first number of records 138 in first table 134 may be created using number of source records 120 in source table 118. As one illustrative example, first record 144 in first number of records 138 may be created using source record 124. In this manner, first record 144 may correspond to source record 124. First record 144 may include first number of fields 146 of first number of field types 140 and second number of fields 148 of second number of field types 142.

Memory update module 130 may copy the information from number of fields 126 for source record 124 into first number of fields 146 for first record 144. In particular, memory update module 130 may copy the information from the portion of number of fields 126 for portion 143 of number of source field types 122 into first number of fields 146 for first record 144.

First field type 149 may be an example of one of first number of field types 140 in first table 134 that is the same as a field type in portion 143 of number of source field types 122 in source table 118. First field 150 of first field type 149 may be an example of one of first number of fields 146 for first record 144. First field 150 may contain information from field 151 in number of fields 126 for source record 124 in source table 118 having the same field type as first field type 149.

Associative memory 102 may be configured to ingest the information in first field 150 and any other fields in first number of fields 146 for first record 144. In this manner, associative memory 102 may be capable of ingesting the information in source record 124 indirectly using the information in first record 144 in first table 134.

Second field 152 may be an example of one of second number of fields 148 for first record 144. Second field 152 is of second field type 153. The information in second field 152 of second field type 153 may indicate whether associative memory 102 is to ingest or forget the information in first number of fields 146 for first record 144. When associative memory 102 "forgets" information, associative memory 102 may remove the information from plurality of data 108 and/or any associations in plurality of associations 110 that include the information.

For example, when the information in field 151 for source record 124 in source table 118 is changed, memory update module 130 may add new record 154 to first number of records 138 in first table 134. In particular, adder 155 in memory update module 130 may add new record 154 to first number of records 138. New record 154 may correspond to source record 124. In this manner, first number of records 138 may include one or more records, such as first record 144 and new record 154, that correspond to the same source record, such as source record 124 in number of source records 120.

Adder 155 may add information to a field of second field type 153 in new record 154 that indicates that a number of fields of first number of field types 140 for new record 154 are to be ingested by associative memory 102. Further, with the addition of new record 154 to first table 134, marker 159 in memory update module 130 may change the information in second field 152 for first record 144 to indicate that first number of fields 146 for first record 144 is to be forgotten by associative memory 102.

In these illustrative examples, the information that is ingested and/or forgotten by associative memory 102 may be tracked by memory update module 130 using second table 136. As illustrated, second table 136 may include second number of records 156 and third number of field types 157. Second number of records 156 may identify the status of information in first number of records 138 in associative memory 102. Each of second number of records 156 corresponds to one of first number of records 138 in these examples.

Third field type 158 may be an example of one of third number of field types 157. A field of third field type 158 may identify the status of the corresponding record in first number of records 138.

For example, when the information in first record 144 is ingested by associative memory 102, adder 155 in memory update module 130 may be configured to add second record 160 to second number of records 156. In this manner, second record 160 may correspond to first record 144 in first number of records 138.

Second record 160 may include third field 162 of third field type 158. The information in third field 162 may indicate that the information in first number of fields 146 for first record 144 has been ingested and is in associative memory 102. Further, when the information in first number of fields 146 for first record 144 is forgotten by associative memory 102, the information in third field 162 may be changed to indicate that this information has been forgotten by associative memory 102.

In these illustrative examples, the information in first table 134 and/or second table 136 may be updated in response to changes in source table 118 over time. Associative memory 102 may be configured to update using the updated information in first table 134 and/or second table 136. This update may also be referred to as a refresh of associative memory 102.

When associative memory 102 updates, associative memory 102 may perform any number of operations. For example, associative memory 102 may perform at least one of ingesting new information, removing previously ingested information, forming new associations between data, removing existing associations between data, other suitable operations, and combinations thereof. In some cases, a portion of new information that is ingested may be substantially the same as information that was previously ingested but removed. Further, new associations that are formed may include forming associations between new information and previously ingested information that is currently stored in associative memory 102.

Associative memory 102 may update in response to an occurrence of event 132. Event 132 may be, for example, without limitation, user input, a command, a period of time elapsing, an alert, a notification, or some other suitable type of event.

In some illustrative examples, event 132 may be the addition of a new record to first table 134. In other illustrative examples, associative memory 102 may be configured to update continuously. In still other illustrative examples, event 132 may be the creation of a new source table and corresponding new first table.

Memory update module 130 may include comparator 164, first updater 166, second updater 168, and remover 170 in addition to adder 155 and marker 159. Comparator 164 may be configured to compare first table 134 and second table 136 to identify whether the fields for any of first number of records 138 should be ingested or forgotten by associative memory 102.

For example, second field 152 of second field type 153 for first record 144 may indicate that first number of fields 146 for first record 144 is to be ingested by associative memory 102. Comparator 164 may determine whether second record 160 corresponding to first record 144 is present in second table 136.

If second record 160 corresponding to first record 144 is not present, first updater 166 may cause associative memory 102 to ingest first number of fields 146 for first record 144. Adder 155 then may add second record 160 to second number of records 156. However, if second record 160 is present, first updater 166 may cause associative memory 102 to ignore first number of fields 146 for first record 144 when updating.

As another example, second field 152 of second field type 153 for first record 144 may indicate that first number of fields 146 for first record 144 is to be forgotten by associative memory 102. Comparator 164 may determine whether second record 160 corresponding to first record 144 is present in second table 136. If second record 160 is not present, first updater 166 may cause associative memory 102 to ignore first number of fields 146.

Further, if second record 160 is present, comparator 164 may determine whether third field 162 of third field type 158 indicates that the information in first number of fields 146 is currently in associative memory 102. If the information is in associative memory 102, first updater 166 may cause associative memory 102 to forget this information.

Second updater 168 then may change the information in third field 162 to indicate that the information in first number of fields 146 has been forgotten by associative memory 102. However, if third field 162 indicates that the information in first number of fields 146 has already been forgotten, first updater 166 may cause associative memory 102 to ignore first number of fields 146.

In these illustrative examples, remover 170 may be configured to delete first record 144 from first number of records 138 in first table 134 only after the information in first number of fields 146 for first record 144 has been forgotten by associative memory 102. In this manner, the information in first table 134 used to build associative memory 102 may only be deleted once associative memory 102 no longer needs or no longer should include the information.

In this manner, associative memory 102 may be updated without needing to recreate associative memory 102. The use of first table 134 allows associative memory 102 to be updated without using source table 118 and without changing the information in fields of first number of field types 140 in first table 134.

In particular, first updater 166 may be configured to avoid modifying and/or deleting any information in fields of first number of field types 140 in first table 134. In this manner, the number of undesirable inconsistencies formed when updating associative memory 102 in plurality of data 108 may be reduced, minimized, or possibly reduced to zero.

Further, the use of second table 136 may track which of first number of records 138 has been ingested and/or forgotten by associative memory 102 such that additional processing resources are not needed to reingest information that has already been ingested. Still further, with the use of second table 136, associative memory 102 may not try to forget information that has already been forgotten.

The illustration of memory management system 100 in FIG. 1 is not meant to imply physical or architectural limitations to the manner in which an advantageous embodiment may be implemented. Other components in addition to and/or in place of the ones illustrated may be used. Some components may be unnecessary. Also, the blocks are presented to illustrate some functional components. One or more of these blocks may be combined and/or divided into different blocks when implemented in an advantageous embodiment.

For example, in these illustrative examples, first table 134 and second table 136 may be maintained separately from each other within storage system 106 by memory update module 130. However, in other illustrative examples, first table 134 and second table 136 may be part of the same table.

In some illustrative examples, second updater 168 may not be present in memory update module 130. Instead, the functions performed by second updater 168 may be performed by marker 159 in memory update module 130. In other words, marker 159 may change the information in third field 162 to indicate that the information in first number of fields 146 has been forgotten by associative memory 102.

Figure 2A:
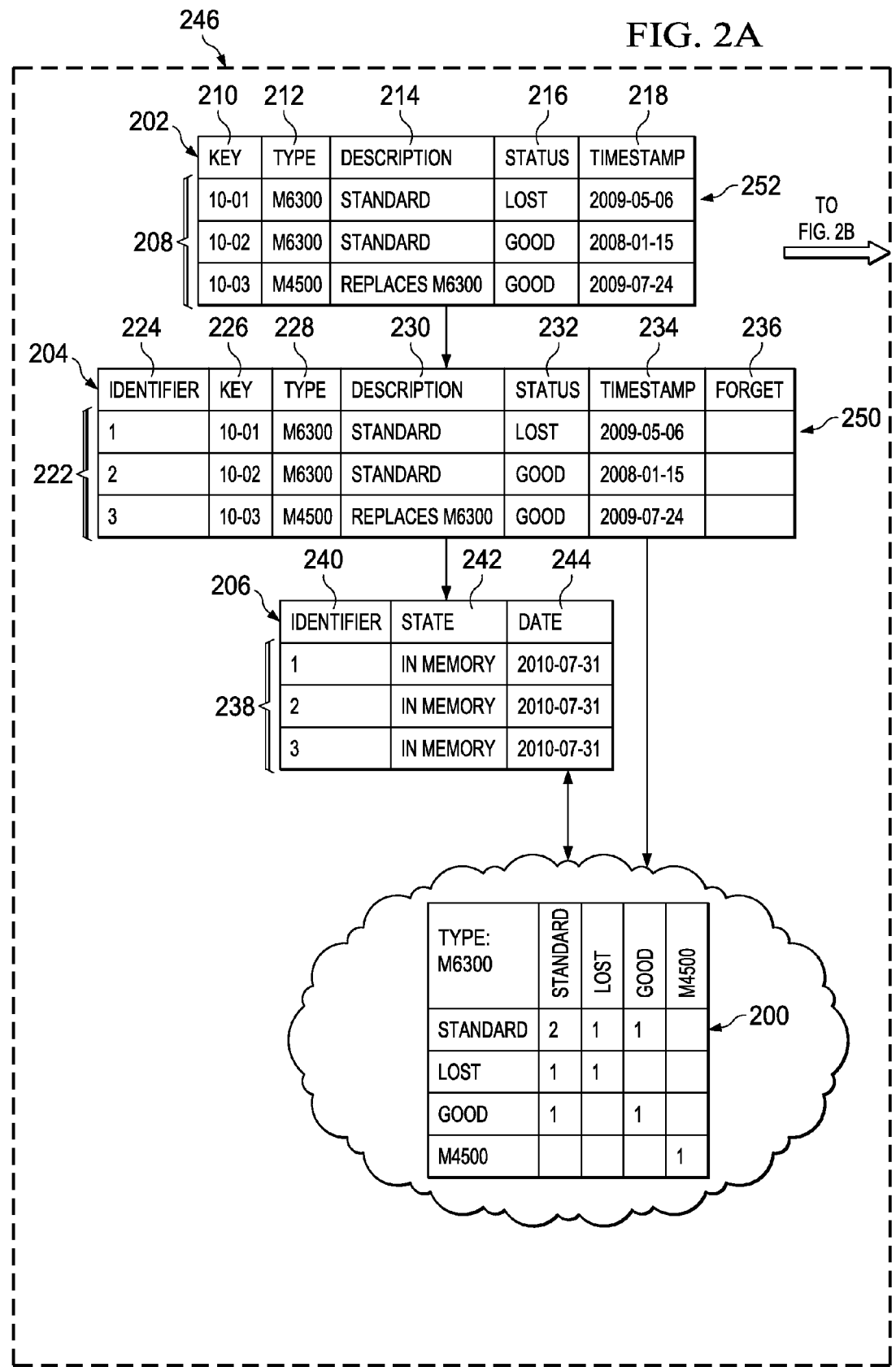

With reference now to FIGS. 2A and 2B, an illustration of a process flow for updating an associative memory is depicted in accordance with an advantageous embodiment. In this illustrative example, associative memory 200 is an example of one implementation for associative memory 102 in FIG. 1. The techniques described with respect to FIGS. 2A and 2B may be implemented using one or more processors, such as processor unit 604 in FIG. 6. The techniques described with respect to FIGS. 2A and 2B may be implemented using a system, such as memory management system 100 of FIG. 1, as referenced further below.

Associative memory 200 may be configured to ingest information originating from source table 202. Source table 202 may be an example of one implementation for source table 118 in FIG. 1. In particular, associative memory 200 may be configured to ingest the information in source table 202 indirectly using first table 204 and second table 206.

As depicted, source table 202 may include source records 208. Source records 208 may be an example of one implementation for number of source records 120 in FIG. 1. Further, source table 202 may include key 210, type 212, description 214, status 216, and timestamp 218. Key 210, type 212, description 214, status 216, and timestamp 218 are examples of one implementation for number of source field types 122 in FIG. 1.

A field in key 210 may provide a unique identifier for the corresponding record in source records 208. A field in type 212 may identify a type of component for which the corresponding record in source records 208 was created. A field in description 214 may describe the component for the corresponding record in source records 208. A field in status 216 may identify the status of the component for the corresponding record in source records 208. Further, a field in timestamp 218 may identify the time at which the corresponding record in source records 208 was created.

First table 204 may include first records 222. First records 222 are examples of one implementation for first number of records 138 in FIG. 1. Further, first table 204 also may include identifier 224, key 226, type 228, description 230, status 232, timestamp 234, and forget indication 236.

Key 226, type 228, description 230, status 232, and timestamp 234 are examples of one implementation for first number of field types 140 in FIG. 1. Further, key 226, type 228, description 230, status 232, and timestamp 234 in first table 204 may be substantially the same field types as key 210, type 212, description 214, status 216, and timestamp 218 in source table 202. Associative memory 200 may be configured to ingest information in the fields for key 226, type 228, description 230, status 232, and timestamp 234 in first table 204.

Identifier 224 and forget indication 236 are examples of one implementation for second number of field types 142 in FIG. 1. In particular, forget indication 236 may be an example of one implementation for second field type 153 in FIG. 1. In these illustrative examples, associative memory 200 may be configured to avoid ingesting fields for identifier 224 and forget indication 236. However, in other illustrative examples, fields for identifier 224 may be ingested.

A field in identifier 224 may provide a unique identifier for the corresponding record in first records 222. A field in forget indication 236 may indicate whether the information in fields for key 226, type 228, description 230, status 232, and timestamp 234 for the corresponding record in first records 222 is to be ingested or forgotten by associative memory 200.

In this illustrative example, a field for key 226 for a particular record in first records 222 may be selected to match a field for key 210 in source table 202. In this manner, each record in first records 222 may match to a record in source records 208. Further, the information in fields for type 228, description 230, status 232, and timestamp 234 for a particular record in first records 222 may be copied from the matching record in source table 202.

Further, second table 206 may include second records 238. Second records 238 are examples of one implementation for second number of records 156 in FIG. 1. Further, second table 206 also may include identifier 240, state 242, and date 244. Identifier 240, state 242, and date 244 are examples of one implementation for third number of field types 157 in FIG. 1. In particular, state 242 may be an example of one implementation for third field type 158 in FIG. 1.

A field in identifier 240 may provide a unique identifier for the corresponding record in second records 238. This unique identifier may be selected to match a corresponding unique identifier for first records 222. In this manner, each record in second records 238 may correspond to a record in first records 222. A field in state 242 for a particular record in second records 238 may indicate whether information in the corresponding record in first records 222 is in associative memory 200 or has been forgotten by associative memory 200.

In these illustrative examples, associative memory 200, source table 202, first table 204, and second table 206 may be in original state 246 after associative memory 200 has been built using first table 204. As depicted by the information in second table 206, the desired information in all of first records 222 in first table 204 may be in associative memory 200 after associative memory 200 is built.

However, updates may be made to source table 202 that cause updates to first table 204, second table 206, and associative memory 200. In response to these different updates, associative memory 200, source table 202, first table 204, and second table 206 have updated state 248.

As one illustrative example, record 250 in first table 204 may correspond to record 252 in source table 202. The information in field 254 and field 256 for record 252 in original state 246 for source table 202 may be changed in updated state 248 for source table 202.

In response to this change, new record 258 may be added to first table 204 in updated state 248 for first table 204. New record 258 corresponds to record 252 in source table 202. New record 258 may include the updated information in field 254 and field 256.

Further, in updated state 248 for first table 204, information in field 260 of record 250 in first table 204 may be changed. In particular, information may be added to field 260 to indicate that the information in record 250 previously ingested by associative memory 200 is to be forgotten by associative memory 200.

Associative memory 200 may use information provided by, for example, memory update module 130 in FIG. 1, to update the information stored in associative memory 200. For example, memory update module 130 may provide associative memory 200 with an identification of which records in first table 204 in updated state 248 are to be ingested and which records are to be forgotten.

As one illustrative example, memory update module 130 in FIG. 1 may perform a comparison between first table 204 in updated state 248 and second table 206 in original state 246. This comparison may indicate that new record 258 has not yet been ingested by associative memory 200. Further, the comparison indicates that record 250 has not yet been forgotten by associative memory 200.

Based on this comparison, memory update module 130 may send associative memory 200 information indicating that new record 258 is to be ingested, and record 250 is to be forgotten. Associative memory 200 may ingest the desired information in new record 258 in first table 204 and forget the information previously ingested from record 250 in first table 204. In response to this update, memory update module 130 may add new record 262 to second table 206 such that second table 206 is updated to updated state 248.

New record 262 may correspond to new record 258 in first table 204. Field 264 in new record 262 may indicate that the desired information from new record 258 in first table 204 has been ingested by associative memory 200 and is currently in associative memory 200.

Further, record 266 in second table 206 may correspond to record 250 in first table 204. In updated state 248, field 268 in record 266 in second table 206 may indicate that the information in record 250 in first table 204 that was previously ingested by associative memory 200 has been forgotten by associative memory 200.

In this manner, associative memory 200 may be updated using first table 204 and second table 206 without directly using source table 202. Further, associative memory 200 may ingest updated information using new records in first table 204, as compared to using modified records in source table 202.

Figure 3:
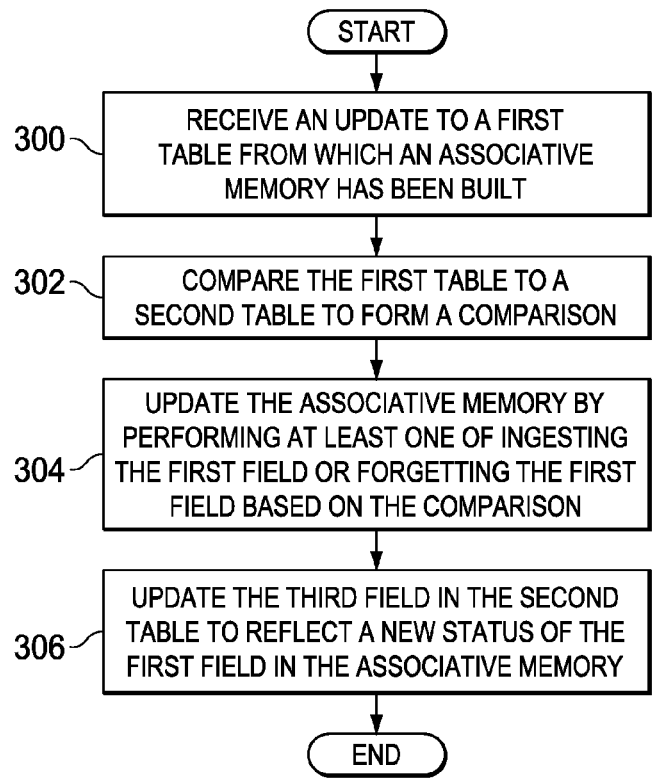
FIG. 3 is an illustration of a flowchart of a process for updating an associative memory in accordance with an advantageous embodiment.

With reference now to FIG. 3, an illustration of a flowchart of a process for updating an associative memory is depicted in accordance with an advantageous embodiment. The process illustrated in FIG. 3 may be implemented to update associative memory 102 in FIG. 1 and/or associative memory 200 in FIGS. 2A and 2B. The techniques described with respect to FIG. 3 may be implemented using one or more processors, such as processor unit 604 in FIG. 6. The techniques described with respect to FIG. 3 may be implemented using a system, such as memory management system 100 of FIG. 1, as referenced further below.

Further, the process described with respect to FIG. 3 may be implemented by a system. As used with respect to FIG. 3, the term "system" may include one or more of memory management system 100 of FIG. 1, processor unit 604 in FIG. 6, hardware implementations, software implementations, and combinations thereof. The process described with respect to FIG. 3 may be implemented in the form of a computer program product embodied in a non-transitory computer readable storage medium.

The process begins by the system receiving an update to a first table from which an associative memory has been built (operation 300). The first table may include a first record in which the first record comprises a first field and a second field. The associative memory may be configured to ingest the first field and avoid ingesting the second field. The associative memory may include a plurality of data and a plurality of associations among the plurality of data.

The system then may compare the first table to a second table to form a comparison (operation 302). The second table may include a second record in which the second record includes a third field. The third field may store first information indicating at least one of whether the first field has been ingested by the associative memory or has been forgotten by the associative memory.

The system then may update the associative memory by performing at least one of ingesting the first field or forgetting the first field based on the comparison (operation 304). In particular, in operation 304, the system may ingest the first field when the second field in the first table indicates that the first field is to be ingested and when the third field in the second table indicates that the first field has not yet been ingested by the associative memory.

Further, in operation 304, the system may forget the first field when the second field in the first table indicates that the first field is to be forgotten and when the third field in the second table indicates that the first field has been ingested but not yet forgotten by the associative memory. Thereafter, the system may update the third field in the second table to reflect a new status of the first field in the associative memory (operation 306), with the process terminating thereafter.

Figure 4:
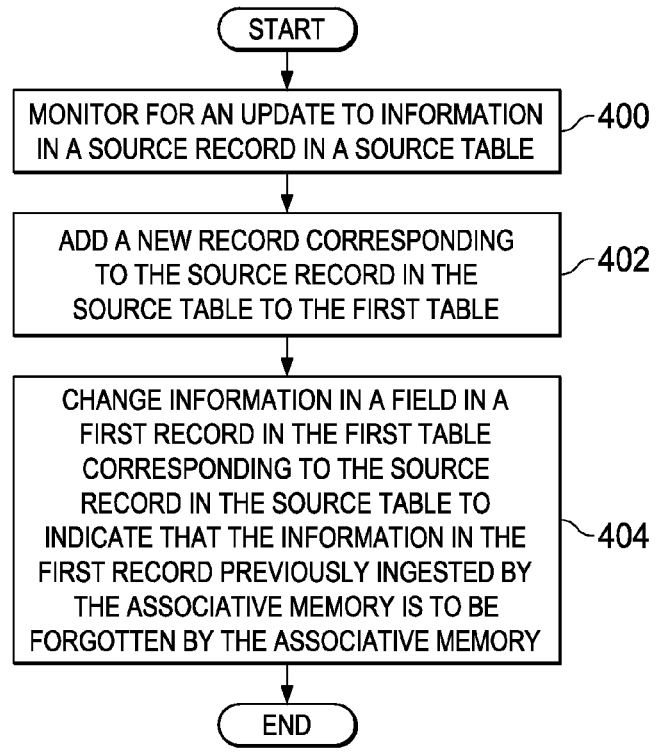
FIG. 4 is an illustration of a flowchart of a process for updating a first table from which an associative memory is built in accordance with an advantageous embodiment.

With reference now to FIG. 4, an illustration of a flowchart of a process for updating a first table from which an associative memory is built is depicted in accordance with an advantageous embodiment. The process illustrated in FIG. 4 may be implemented to update first table 134 in FIG. 1 and/or first table 204 in FIG. 2. In particular, this process may be used to generate the update to the first table received in operation 300 in FIG. 3. The techniques described with respect to FIG. 4 may be implemented using one or more processors, such as processor unit 604 in FIG. 6. The techniques described with respect to FIG. 4 may be implemented using a system, such as memory management system 100 of FIG. 1, as referenced further below.

The process described with respect to FIG. 4 may be implemented by a system. As used with respect to FIG. 4, the term "system" may include one or more of memory management system 100 in FIG. 1, processor unit 604 in FIG. 6, hardware implementations, software implementations, and combinations thereof. The process described with respect to FIG. 4 may be implemented in the form of a computer program product embodied in a non-transitory computer readable storage medium.

The process begins by the system monitoring for an update to information in a source record in a source table (operation 400). In this illustrative example, a source table may be, for example, source table 118 in FIG. 1 and/or source table 202 in FIG. 2.

In response to detecting the update to the information in the source record in the source table, the system may add a new record corresponding to the source record in the source table to the first table (operation 402). In operation 402, the new record added to the first table may include the updated information in the source record in the source table.

Thereafter, the system may change information in a field in a first record in the first table corresponding to the source record in the source table to indicate that the information in the first record previously ingested by the associative memory is to be forgotten by the associative memory (operation 404), with the process terminating thereafter.

Figure 5:
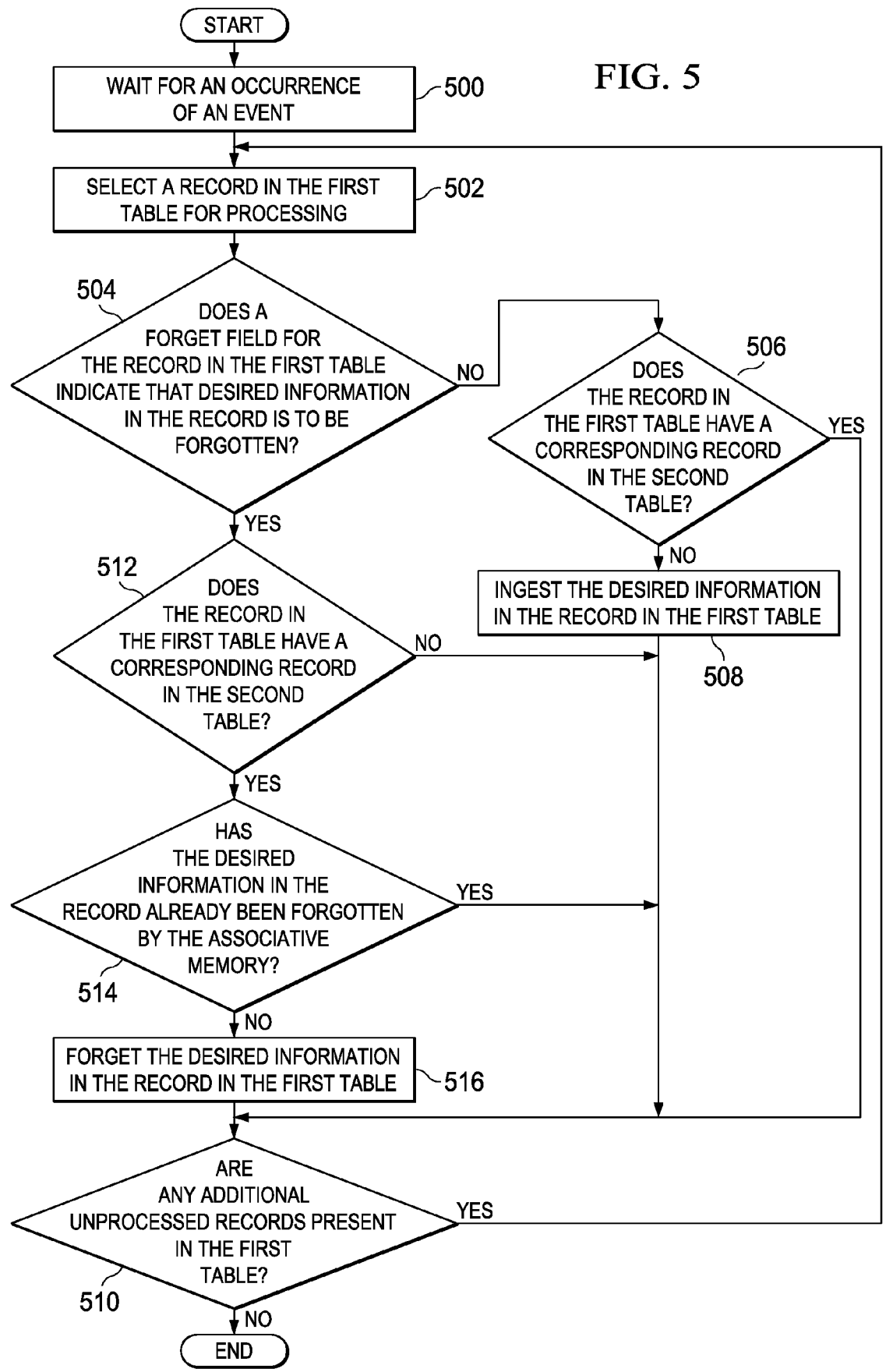
FIG. 5 is an illustration of a flowchart of a process for updating an associative memory in accordance with an advantageous embodiment.

With reference now to FIG. 5, an illustration of a flowchart of a process for updating an associative memory is depicted in accordance with an advantageous embodiment. The process illustrated in FIG. 5 may be implemented to update associative memory 102 in FIG. 1 and/or associative memory 200 in FIG. 2. The techniques described with respect to FIG. 5 may be implemented using one or more processors, such as processor unit 604 in FIG. 6. The techniques described with respect to FIG. 5 may be implemented using a system, such as memory management system 100 of FIG. 1, as referenced further below.

The process described with respect to FIG. 5 may be implemented by a system. As used with respect to FIG. 5, the term "system" may include one or more of memory management system 100 in FIG. 1, processor unit 604 in FIG. 6, hardware implementations, software implementations, and combinations thereof. The process described with respect to FIG. 5 may be implemented in the form of a computer program product embodied in a non-transitory computer readable storage medium.

The process begins by the system waiting for an occurrence of an event (operation 500). The event may be, for example, a period of time elapsing, an update to a first table from which the associative memory is built, an alert, and/or some other suitable type of event.

The first table may have records comprising fields of a first number of field types and a second number of field types. The associative memory may be configured to ingest fields of the first number of field types for a particular record in the first table and avoid ingesting fields of the second number of field types for the particular record when ingesting the particular record.

The system then may select a record in the first table for processing (operation 502). The system then may determine whether a forget field for the record in the first table indicates that desired information in the record is to be forgotten (operation 504). If the forget field for the record in the first table does not indicate that the desired information in the record is to be forgotten, the system may determine whether the record in the first table has a corresponding record in the second table (operation 506).

If the first table does not have a corresponding record in the second table, the associative memory may ingest the desired information in the record in the first table (operation 508). Thereafter, the system may determine whether any additional unprocessed records are present in the first table (operation 510). If additional unprocessed records are not present in the first table, the process terminates. Otherwise, the process returns to operation 502 as described above.

With reference again to operation 506, if the record in the first table has a corresponding record in the second table, the system may proceed to operation 510 as described above. With reference again to operation 504, if the forget field for the record in the first table indicates that the desired information in the record is to be forgotten, the system may determine whether the record in the first table has a corresponding record in the second table (operation 512).

If the first table does not have a corresponding record in the second table, the process proceeds to operation 510 as described above. Otherwise, if the first table has a corresponding record in the second table, the system may determine whether the desired information in the record has already been forgotten by the associative memory (operation 514).

If the desired information has already been forgotten, the process proceeds to operation 510 as described above. Otherwise, the associative memory may forget the desired information in the record in the first table (operation 516). Thereafter, the process proceeds to operation 510 as described above.

The flowcharts and block diagrams in the different depicted embodiments illustrate the architecture, functionality, and operation of some possible implementations of apparatus and methods in an advantageous embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an advantageous embodiment, the function or functions noted in the block may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Turning now to FIG. 6, an illustration of a data processing system is depicted in accordance with an advantageous embodiment. In this illustrative example, data processing system 600 may be used to implement one or more computers in computer system 104 in FIG. 1. Data processing system 600 includes communications fabric 602, which provides communications between processor unit 604, memory 606, persistent storage 608, communications unit 610, input/output (I/O) unit 612, and display 614.

Processor unit 604 serves to execute instructions for software that may be loaded into memory 606. Processor unit 604 may be a number of processors, a multi-processor core, or some other type of processor, depending on the particular implementation. A number, as used herein with reference to an item, means one or more items. Further, processor unit 604 may be implemented using a number of heterogeneous processor systems in which a main processor is present with secondary processors on a single chip. As another illustrative example, processor unit 604 may be a symmetric multi-processor system containing multiple processors of the same type.

Memory 606 and persistent storage 608 are examples of storage devices 616. A storage device is any piece of hardware that is capable of storing information, such as, for example, without limitation, data, program code in functional form, and/or other suitable information either on a temporary basis and/or a permanent basis. Storage devices 616 may also be referred to as computer readable storage devices in these examples. Memory 606, in these examples, may be, for example, a random access memory or any other suitable volatile or non-volatile storage device. Persistent storage 608 may take various forms, depending on the particular implementation.

For example, persistent storage 608 may contain one or more components or devices. For example, persistent storage 608 may be a hard drive, a flash memory, a rewritable optical disk, a rewritable magnetic tape, or some combination of the above. The media used by persistent storage 608 also may be removable. For example, a removable hard drive may be used for persistent storage 608.

Communications unit 610, in these examples, provides for communications with other data processing systems or devices. In these examples, communications unit 610 is a network interface card. Communications unit 610 may provide communications through the use of either or both physical and wireless communications links.

Input/output unit 612 allows for input and output of data with other devices that may be connected to data processing system 600. For example, input/output unit 612 may provide a connection for user input through a keyboard, a mouse, and/or some other suitable input device. Further, input/output unit 612 may send output to a printer. Display 614 provides a mechanism to display information to a user.

Instructions for the operating system, applications, and/or programs may be located in storage devices 616, which are in communication with processor unit 604 through communications fabric 602. In these illustrative examples, the instructions are in a functional form on persistent storage 608. These instructions may be loaded into memory 606 for execution by processor unit 604. The processes of the different embodiments may be performed by processor unit 604 using computer-implemented instructions, which may be located in a memory, such as memory 606.

These instructions are referred to as program code, computer usable program code, or computer readable program code that may be read and executed by a processor in processor unit 604. The program code in the different embodiments may be embodied on different physical or computer readable storage media, such as memory 606 or persistent storage 608.

Program code 618 is located in a functional form on computer readable media 620 that is selectively removable and may be loaded onto or transferred to data processing system 600 for execution by processor unit 604. Program code 618 and computer readable media 620 form computer program product 622 in these examples. In one example, computer readable media 620 may be computer readable storage media 624 or computer readable signal media 626. Computer readable storage media 624 may include, for example, an optical or magnetic disk that is inserted or placed into a drive or other device that is part of persistent storage 608 for transfer onto a storage device, such as a hard drive, that is part of persistent storage 608.

Computer readable storage media 624 also may take the form of a persistent storage, such as a hard drive, a thumb drive, or a flash memory, that is connected to data processing system 600. In some instances, computer readable storage media 624 may not be removable from data processing system 600. In these examples, computer readable storage media 624 is a physical or tangible storage device used to store program code 618 rather than a medium that propagates or transmits program code 618. Computer readable storage media 624 is also referred to as a computer readable tangible storage device or a computer readable physical storage device. In other words, computer readable storage media 624 is a media that can be touched by a person.

Alternatively, program code 618 may be transferred to data processing system 600 using computer readable signal media 626. Computer readable signal media 626 may be, for example, a propagated data signal containing program code 618. For example, computer readable signal media 626 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some advantageous embodiments, program code 618 may be downloaded over a network to persistent storage 608 from another device or data processing system through computer readable signal media 626 for use within data processing system 600. For instance, program code stored in a computer readable storage medium in a server data processing system may be downloaded over a network from the server to data processing system 600. The data processing system providing program code 618 may be a server computer, a client computer, or some other device capable of storing and transmitting program code 618.

The different components illustrated for data processing system 600 are not meant to provide architectural limitations to the manner in which different embodiments may be implemented. The different advantageous embodiments may be implemented in a data processing system including components in addition to or in place of those illustrated for data processing system 600. Other components shown in FIG. 6 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 604 may take the form of a hardware unit that has circuits that are manufactured or configured for a particular use. This type of hardware may perform operations without needing program code to be loaded into a memory from a storage device to be configured to perform the operations.

For example, when processor unit 604 takes the form of a hardware unit, processor unit 604 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 618 may be omitted, because the processes for the different embodiments are implemented in a hardware unit.

In still another illustrative example, processor unit 604 may be implemented using a combination of processors found in computers and hardware units. Processor unit 604 may have a number of hardware units and a number of processors that are configured to run program code 618. With this depicted example, some of the processes may be implemented in the number of hardware units, while other processes may be implemented in the number of processors.

In another example, a bus system may be used to implement communications fabric 602 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of devices that transmit data, receive data, or transmit and receive data. A communications unit may be, for example, a modem or a network adapter, two network adapters, or some combination thereof. Further, a memory may be, for example, memory 606, or a cache, such as found in an interface and memory controller hub that may be present in communications fabric 602.

Thus, the different advantageous embodiments provide a method and apparatus for updating an associative memory that does not require rebuilding the associative memory. In one advantageous embodiment, a system may include an associative memory, a first table, a second table, a comparator, and an updater. The associative memory may include a plurality of data and a plurality of associations among the plurality of data.

The associative memory may be built from the first table. The first table may include a first record in which the first record may include a first field and a second field. The associative memory may be configured to ingest the first field and avoid ingesting the second field. The second table may include a second record in which the second record includes a third field. The third field stores first information indicating at least one of whether the first field has been ingested by the associative memory or has been forgotten by the associative memory.

The comparator may be configured to compare the first table and the second table to identify one of whether the first field should be forgotten by the associative memory or whether the first field should be ingested by the associative memory. The updater may be configured to update the associative memory by performing one of ingesting the first field or forgetting the first field.

In one advantageous embodiment, a system may include an associative memory, a first table, a second table, a comparator, and an updater. The associative memory may include a plurality of data and a plurality of associations among the plurality of data. The first table may include a first number of first records in which each of the first records includes a first number of first fields that are able to be ingested by the associative memory and a second number of second fields that are not to be ingested by the associative memory. The associative memory was built from the first table. The second table may include a second number of second records in which each of the second records includes a third number of third fields that includes a previous status of a corresponding one of the first number of first fields that had been previously ingested by the associative memory. The first table and the second table may be maintained separately from each other or may be part of one table.

The comparator may be configured to compare the first table and the second table to determine at least one of a first set of the first records that are to be ingested by the associative memory and a second set of the first records that are to be forgotten by the associative memory. The updater may be configured to update the associative memory by performing at least one of ingesting the first set and forgetting the second set.

Further, the third number of the third fields may include a first group of fields that contains information configured to indicate which of the first records have been ingested in the associative memory. The third number of the third fields may include a second group of fields that contains additional information configured to identify records in the first table.

The updater may be configured to avoid modifying or deleting the first number of the first fields. Further, a second updater may be present in the system configured to update the second table to reflect a new status of the third number of the second fields and to add a status of new records.

Still further, the system may comprise at least one of a remover, an adder, and a marker. The remover may be configured to delete a third record of the first records from the first table, including deleting corresponding fields from the first number of the first fields of the third record, only after the third record has been forgotten by the associative memory. The adder may be configured for adding a fourth record of the first records to the first table, before the associative memory has been updated. The marker may be configured for marking a fifth record of the first records to be forgotten. The marker may change at least one of the second number of the second fields of the fifth record.

In yet another advantageous embodiment, a method is provided for updating an associative memory. An update to a first table from which an associative memory has been built may be received in a first tangible memory. The first table may include a first number of first records in which each of the first records may include a first number of first fields ingestible by the associative memory and a second number of second fields not to be ingested by the associative memory. The associative memory may include a plurality of data and a plurality of associations among the plurality of data. A first processor may be used to compare the first table to a second table in a second tangible memory. The second table may include a second number of second records in which each of the second records may include a previous status of a corresponding one of the first number of first fields that had been previously ingested by the associative memory. A comparison may be formed. A second processor may be used to update the associative memory by performing at least one of ingesting in the associative memory a first set of the first records based on the comparison and forgetting in the associative memory a second set of the first records based on the comparison.

Further, the first processor, in comparing the first table to the second table, may compare the second number of the second fields with the third number of the third fields for each of the first number of the first records and the second number of the second records. The second table may be updated to reflect a new status of the second number of the second fields and a status of new records. Updating the associative memory may include avoiding, modifying, or deleting the first number of the first fields. Still further, the second set may be forgotten in the associative memory and thereafter deleted from the first table. In some illustrative examples, the first processor and the second processor may comprise one processor, and the first tangible memory and the second tangible memory may comprise one tangible memory.

The description of the different advantageous embodiments has been presented for purposes of illustration and description and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system comprising:
    an associative memory comprising a plurality of data and a plurality of associations among the plurality of data;
    a first table from which the associative memory has been built, wherein the first table comprises a first record, wherein the first record comprises a first field and a second field, wherein the associative memory is configured to ingest the first field, and wherein the associative memory is further configured to avoid ingesting the second field;
    a second table comprising a second record, wherein the second record includes a third field, and wherein the third field stores first information indicating at least one of: whether the first field has been ingested by the associative memory or has been forgotten by the associative memory;
    a comparator configured to compare the first table and the second table to identify one of: whether the first field should be forgotten by the associative memory or whether the first field should be ingested by the associative memory; and
    an updater configured to update the associative memory by performing one of: ingesting the first field or forgetting the first field.

2. The system of claim 1, wherein the second field contains second information indicating whether the first field should be forgotten by the associative memory or ignored by the updater if the first field has not yet been ingested by the associative memory.

3. The system of claim 1, wherein the comparator is further configured to compare the third field to the second field.

4. The system of claim 2, wherein the updater is configured to update the associative memory by forgetting the first field when the second information in the second field indicates that the first field should be forgotten and also when the first information in the third field indicates that the first field has been ingested in the associative memory.

5. The system of claim 1 further comprising:
    a second updater configured to update the second table such that the first information indicates that the first field has been forgotten or ingested by the associative memory.

6. The system of claim 1, wherein the first table and the second table are maintained separately from each other.

7. The system of claim 1, wherein the first table and the second table are part of one table.

8. The system of claim 1, wherein the updater is configured to avoid modifying or deleting the first field.

9. The system of claim 1 further comprising:
    a remover configured to delete the first record from the first table, only after the first field has been forgotten by the associative memory.

10. The system of claim 1 further comprising:
    an adder configured to add a third record to the first table, before the associative memory has been updated, and wherein the third record is to be ingested by the associative memory upon update of the associative memory.

11. The system of claim 2 further comprising:
    a marker configured to change the second information in the second field to indicate that the first field should be forgotten by the associative memory.

12. A method comprising:
    receiving, in a first tangible memory, an update to a first table from which an associative memory has been built, wherein the first table comprises a first record, wherein the first record comprises a first field and a second field, wherein the associative memory is configured to ingest the first field, wherein the associative memory comprises a plurality of data and a plurality of associations among the plurality of data, and wherein the associative memory is further configured to avoid ingesting the second field;
    comparing, using a first processor, the first table to a second table in a second tangible memory to identify one of: whether the first field should be forgotten by the associative memory or whether the first field should be ingested by the associative memory, wherein the second table comprises a second record, wherein the second record includes a third field, and wherein the third field stores first information indicating at least one of: whether the first field has been ingested by the associative memory or has been forgotten by the associative memory, and wherein a comparison is formed; and
    updating, using a second processor, the associative memory by performing one of: ingesting the first field or forgetting the first field.

13. The method of claim 12, wherein the second field contains second information indicating whether the first field should be forgotten by the associative memory or ignored by the second processor if the first field has not yet been ingested by the associative memory, and wherein comparing comprises comparing the third field to the second field.

14. The method of claim 13, wherein updating comprises updating the associative memory by forgetting the first field when the second information in the second field indicates that the first field should be forgotten and also when the first information in the third field indicates that the first field has been ingested in the associative memory.

15. The method of claim 12 further comprising:
updating, by a third processor, the second table such that the first information indicates that the first field has been forgotten or ingested by the associative memory.

16. The method of claim 12, wherein the first table and the second table are maintained separately from each other.

17. The method of claim 12, wherein the first processor and the second processor comprise one processor, and wherein the first tangible memory and the second tangible memory comprise one tangible memory.

18. The method of claim 13 further comprising at least one of:
deleting, by a third processor, the first record from the first table, only after the first field has been forgotten by the associative memory;
adding, by a fourth processor, a third record to the first table before the associative memory has been updated, and wherein the third record is to be ingested by the associative memory upon update of the associative memory; and
changing, by a fifth processor, the second information in the second field to indicate that the first field should be forgotten by the associative memory.

19. A non-transitory computer readable storage medium storing computer usable program code comprising:
computer usable program code for receiving, in a first tangible memory, an update to a first table from which an associative memory has been built, wherein the first table comprises a first record, wherein the first record comprises a first field and a second field, wherein the associative memory is configured to ingest the first field, wherein the associative memory comprises a plurality of data and a plurality of associations among the plurality of data, and wherein the associative memory is further configured to avoid ingesting the second field;
computer usable program code for comparing, using a first processor, the first table to a second table in a second tangible memory to identify one of: whether the first field should be forgotten by the associative memory or whether the first field should be ingested by the associative memory, wherein the second table comprises a second record, wherein the second record includes a third field, and wherein the third field stores first information indicating at least one of: whether the first field has been ingested by the associative memory or has been forgotten by the associative memory, and wherein a comparison is formed; and
computer usable program code for updating, using a second processor, the associative memory by performing one of: ingesting the first field or forgetting the first field.

20. The non-transitory computer readable storage medium of claim 19 further comprising:
computer usable program code for updating, by a third processor, the second table such that the first information indicates that the first field has been forgotten or ingested by the associative memory.

* * * * *